(12) United States Patent
Shang et al.

(10) Patent No.: US 10,217,391 B2
(45) Date of Patent: Feb. 26, 2019

(54) SHIFT REGISTER UNIT, GATE DRIVING CIRCUIT AND DRIVING METHOD THEREOF, AND DISPLAY APPARATUS

(71) Applicant: BOE TECHNOLOGY GROUP CO., LTD., Beijing (CN)

(72) Inventors: Guangliang Shang, Beijing (CN); Xing Yao, Beijing (CN); Seungwoo Han, Beijing (CN); Yujie Gao, Beijing (CN); Yuanbo Zhang, Beijing (CN); Ming Chen, Beijing (CN); Jungmok Jun, Beijing (CN); Xue Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 99 days.

(21) Appl. No.: 15/541,639

(22) PCT Filed: Sep. 18, 2016

(86) PCT No.: PCT/CN2016/099181
§ 371 (c)(1),
(2) Date: Jul. 5, 2017

(87) PCT Pub. No.: WO2017/185590
PCT Pub. Date: Nov. 2, 2017

(65) Prior Publication Data
US 2018/0204494 A1    Jul. 19, 2018

(30) Foreign Application Priority Data

Apr. 26, 2016 (CN) .......................... 2016 1 0267107

(51) Int. Cl.
*G11C 19/28* (2006.01)
*G09G 3/32* (2016.01)
(Continued)

(52) U.S. Cl.
CPC ............. *G09G 3/20* (2013.01); *G09G 3/3266* (2013.01); *G09G 3/3677* (2013.01); *G11C 19/28* (2013.01);
(Continued)

(58) Field of Classification Search
CPC ...... G09G 3/20; G09G 3/3266; G09G 3/3674; G09G 3/3677; G09G 2300/0408;
(Continued)

(56) References Cited

U.S. PATENT DOCUMENTS 9,390,674 B2 *   7/2016   Xiao ..................... G09G 3/3677
9,407,260 B2 *   8/2016   Xiao ..................... G09G 3/3655
(Continued)

FOREIGN PATENT DOCUMENTS

CN          101552040 A        10/2009
CN          101645308 A        2/2010
(Continued)

OTHER PUBLICATIONS

First Office Action for Chinese Patent Application No. 201610267107.1 dated Jul. 5, 2017.
(Continued)

*Primary Examiner* — Patrick O'Neill
(74) *Attorney, Agent, or Firm* — Calfee, Halter & Griswold LLP (57) ABSTRACT

Disclosed is a shift register unit, a gate driving circuit and a driving method, as well as a display apparatus. The shift register unit has a working cycle including an input phase, an output phase, a reset phase and a maintaining phase. In the reset phase, a clock signal is transmitted to an output terminal to pull a voltage of the output terminal down to a reference voltage, and the pulled-down voltage of the output terminal is subsequently changed from the reference voltage to a gate-off voltage. In the maintaining phase, the voltage (Continued)

of the output terminal is maintained at the gate-off voltage. The reference voltage is smaller than the gate-off voltage.

20 Claims, 4 Drawing Sheets

(51) Int. Cl.
G09G 3/36 (2006.01)
G09G 3/20 (2006.01)
G09G 3/3266 (2016.01)

(52) U.S. Cl.
CPC ... *G11C 19/287* (2013.01); *G09G 2300/0408* (2013.01); *G09G 2310/0267* (2013.01); *G09G 2310/0286* (2013.01)

(58) Field of Classification Search
CPC ... G09G 2310/0267; G09G 2310/0286; G11C 19/28; G11C 19/287
See application file for complete search history.

(56) References Cited

U.S. PATENT DOCUMENTS

| | | | | |
|---|---|---|---|---|
| 9,484,111 | B2* | 11/2016 | Xiao | G11C 19/28 |
| 9,501,989 | B2* | 11/2016 | Xiao | G11C 19/28 |
| 9,514,695 | B2* | 12/2016 | Dai | G09G 3/3648 |
| 9,553,577 | B2* | 1/2017 | Xiao | G09G 3/3677 |
| 2007/0035505 | A1* | 2/2007 | Lin | G09G 3/3648 |
| | | | | 345/100 |
| 2010/0277206 | A1 | 11/2010 | Lee et al. | |
| 2012/0008731 | A1 | 1/2012 | Hsu et al. | |
| 2013/0002310 | A1 | 1/2013 | Liu | |
| 2013/0181747 | A1 | 7/2013 | Yoon et al. | |
| 2014/0055436 | A1 | 2/2014 | Han et al. | |
| 2014/0354523 | A1 | 12/2014 | So et al. | |
| 2015/0002504 | A1 | 1/2015 | Jo | |
| 2015/0206495 | A1 | 7/2015 | Xu | |
| 2015/0371599 | A1 | 12/2015 | Xiao | |
| 2016/0307531 | A1 | 10/2016 | Xiao | |
| 2016/0343322 | A1 | 11/2016 | Xiao | |
| 2017/0213512 | A1 | 7/2017 | Dai | |
| 2017/0270851 | A1* | 9/2017 | Shang | G11C 19/28 |

FOREIGN PATENT DOCUMENTS

| | | |
|---|---|---|
| CN | 101877202 A | 11/2010 |
| CN | 102136241 A | 7/2011 |
| CN | 102314828 A | 1/2012 |
| CN | 102426817 A | 4/2012 |
| CN | 202771779 A | 3/2013 |
| CN | 103208262 A | 7/2013 |
| CN | 103514843 A | 1/2014 |
| CN | 103632642 A | 3/2014 |
| CN | 103761949 A | 4/2014 |
| CN | 104050941 A | 9/2014 |
| CN | 104217689 A | 12/2014 |
| CN | 104252851 A | 12/2014 |
| CN | 104464656 A | 3/2015 |
| CN | 104766575 A | 7/2015 |
| CN | 104882108 A | 9/2015 |
| CN | 105185349 A | 12/2015 |
| CN | 204966057 U | 1/2016 |
| CN | 105702194 A | 6/2016 |

OTHER PUBLICATIONS

Search Report for International Application No. PCT/CN2016/099181 dated Feb. 6, 2017.
Second Office Action for Chinese Patent Application No. 201610267107.1 dated Feb. 6, 2018.

* cited by examiner

SHIFT REGISTER UNIT, GATE DRIVING CIRCUIT AND DRIVING METHOD THEREOF, AND DISPLAY APPARATUS

CROSS-REFERENCE TO RELATED APPLICATIONS

The present application is the U.S. national phase entry of PCT/CN2016/099181, with an international filing date of Sep. 18, 2016, which claims the benefit of Chinese Patent Application No. 201610267107.1, filed on Apr. 26, 2016, the entire disclosures of which are incorporated herein by reference.

TECHNICAL FIELD

The present disclosure relates to the field of display technology, and particularly to a shift register unit, a gate driving circuit and a driving method thereof, as well as a display apparatus.

BACKGROUND

With the development of the display technologies, increasing display apparatuses have been equipped with a Gate Driver On Array (GOA) technique where a gate driving circuit is integrated in a non-display area of an array substrate, thereby reducing a width of a bezel of the display apparatus. The gate driving circuit comprises several shift register units each providing a gate driving signal to a corresponding one of multiple gate lines on the array substrate.

A time interval allocated to each row of pixels in the display apparatus is fixed. In this fixed time interval, charging of the pixels and reset of the gate driving signal are to be completed. The display apparatus with a higher resolution may need a longer reset time interval for the gate driving signal, resulting in a short time interval for charging each row of pixels. This is unfavorable for the charging of the pixels.

SUMMARY

Embodiments of the present disclosure provide a shift register unit, a gate driving circuit and a driving method thereof, as well as a display apparatus. The proposed shift register unit may output a gate driving signal with a shortened reset time interval.

According to a first aspect of the present disclosure, a shift register unit is provided which has a working cycle comprising an input phase, an output phase, a reset phase and a maintaining phase. The shift register unit comprises: an input module configured to transmit an input signal to a pull-up node in the input phase to pull up a voltage of the pull-up node; an output module configured to a) in the output phase transmit a clock signal to an output terminal as a gate-on voltage and further pull up the voltage of the pull-up node by a predetermined amount, and to b) in the reset phase transmit the clock signal to the output terminal to pull a voltage of the output terminal down to a reference voltage and pull the voltage of the pull-up node down by the predetermined amount; a first reset module configured to further pull the pulled-down voltage of the pull-up node down to the reference voltage in response to a first reset signal in the reset phase; and a first pull-down control module configured to, in response to a first pull-down control signal, a) change the pulled-down voltage of the output terminal from the reference voltage to a gate-off voltage in the reset phase, and b) maintain the voltage of the pull-up node at the reference voltage and the voltage of the output terminal at the gate-off voltage in the maintaining phase, the reference voltage being smaller than the gate-off voltage.

According to a second aspect of the present disclosure, a gate driving circuit is provided which comprises a plurality of cascaded shift register units as described in the first aspect.

According to a third aspect of the present disclosure, a display apparatus is provided which comprises the gate driving circuit as described in the second aspect.

According to a fourth aspect of the present disclosure, a method of driving the gate driving circuit including a plurality of shift register units is provided. The method comprises: for each of the plurality of shift register units: performing an input phase in which an input signal is transmitted to a pull-up node to pull up a voltage of the pull-up node; performing an output phase in which a clock signal is transmitted to an output terminal as a gate-on voltage and the voltage of the pull-up node is further pulled up by a predetermined amount; performing a reset phase in which the clock signal is transmitted to the output terminal to pull the voltage of the output terminal down to a reference voltage and the voltage of the pull-up node is pulled down by the predetermined amount, the pulled-down voltage of the pull-up node is further pulled down to the reference voltage in response to a first reset signal, and the pulled-down voltage of the output terminal is changed from the reference voltage to a gate-off voltage in response to a first pull-down control signal, the reference voltage being smaller than the gate-off voltage; and performing a maintaining phase in which the voltage of the pull-up node is maintained at the reference voltage and the voltage of the output terminal at the gate-off voltage in response to the first pull-down control signal.

These and other aspects of the present invention will be apparent from and elucidated with reference to the embodiment(s) described hereinafter.

DETAILED DESCRIPTION

The disclosure will now be described more fully hereinafter with reference to the accompanying drawings, in which exemplary embodiments of the disclosure are shown. The present disclosure may, however, be embodied in many different forms and should not be construed as being limited Referring to FIGS. 1 and 4, the shift register unit according to an embodiment of the present disclosure comprises an input module 1, an output module 2, a first reset module 3 and a first pull-down control module 4. A working cycle of the shift register unit comprises an input phase t1, an output phase t2, a reset phase t3 and a maintaining phase t4.

Figure 1:
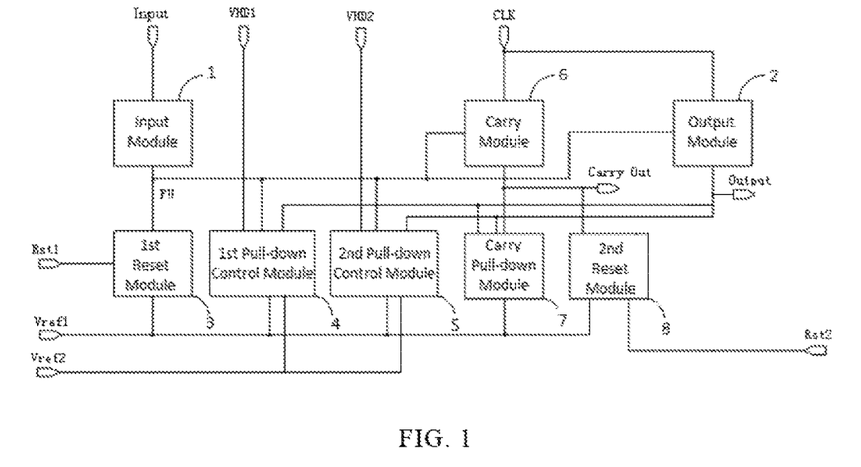
FIG. 1 schematically shows a block diagram of a shift register unit according to an embodiment of the present disclosure.
Figure 4:
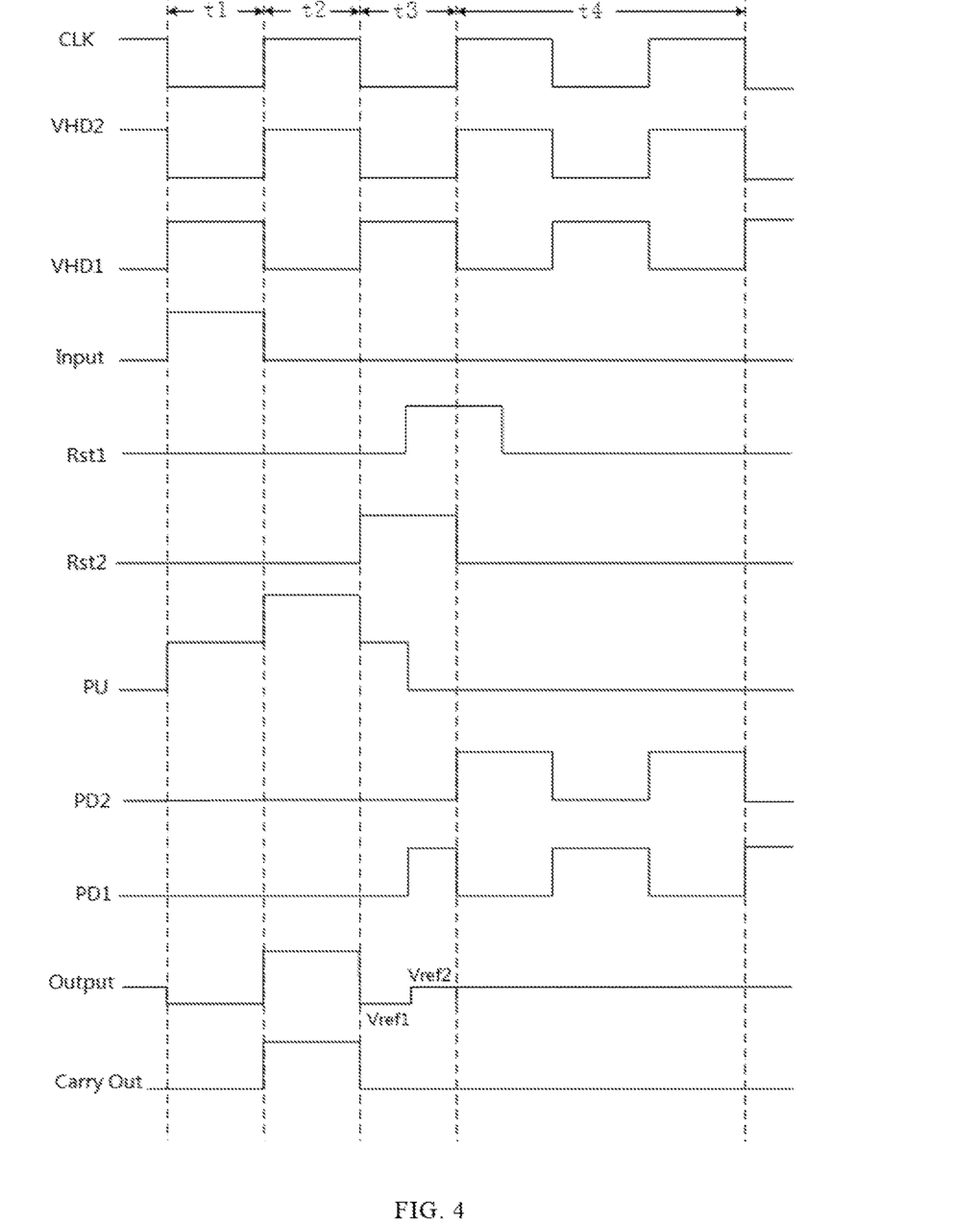
FIG. 4 shows an operation timing diagram of an exemplary circuit of the shift register unit shown in FIG. 3.

The input module 1 is configured to transmit an input signal "Input" to a pull-up node PU in the input phase t to pull up a voltage of the pull-up node PU.

The output module 2 is configured to a) in the output phase t2 transmit a clock signal CLK to an output terminal as a gate-on voltage and further pull up the voltage of the pull-up node PU by a predetermined amount, and to b) in the reset phase t3 transmit the clock signal CLK to the output terminal to pull the voltage of the output terminal down to a reference voltage Vref1 and pull the voltage of the pull-up node PU down by the predetermined amount. A low level of the clock signal CLK is the reference voltage Vref1.

The first reset module 3 is configured to further pull the pulled-down voltage of the pull-up node PU down to the reference voltage Vref1 in response to a first reset signal Rst1 in the reset phase t3.

The first pull-down control module 4 is configured to, responsive to a first pull-down control signal VHD1, change the pulled-down voltage of the output terminal from the reference voltage Vref1 to a gate-off voltage Vref2 in the reset phase t3. The reference voltage Vref1 is smaller than the gate-off voltage Vref2, and the first pull-down control signal VHD1 has a 180-degree phase difference from the clock signal CLK.

The first pull-down control module 4 is further configured to maintain the voltage of the pull-up node PU at the reference voltage Vref1 and the voltage of the output terminal at the gate-off voltage Vref2 in the maintaining phase t4. The voltages output by the output terminal of the shift register unit in respective phases are combined into a gate driving signal "Output". In the maintaining phase t4, the gate driving signal "Output" is maintained at the gate-off voltage Vref2 so that the display apparatus can operate in a stable state.

Figure 2:
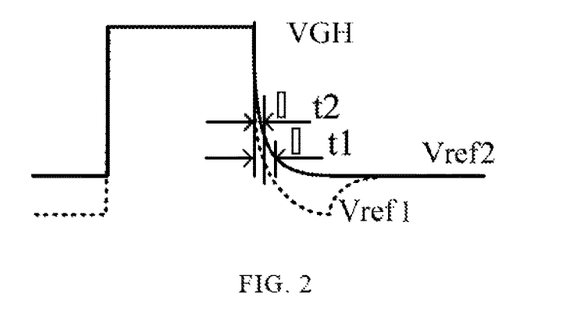
FIG. 2 schematically shows a waveform diagram illustrating reduction of a reset time interval for a gate driving signal.

Referring to FIG. 2, the gate driving signal is first pulled down from a high level VGH to the reference voltage Vref1 that is smaller than the gate-off voltage Vref2, and then changed into the gate-off voltage Vref2. As compared with being pulled down directly to the gate-off voltage Vref2, the gate driving signal falls to a predetermined value (e.g., 10% (VGH−Vref2)) in a shorter time, thereby achieving a fast reset. As shown in FIG. 2, the reset time interval Δt2 is smaller than the reset time interval Δt1. The shortened reset time interval of the gate driving signal may ensure the charging time of the pixels.

Referring back to FIGS. 1 and 4, in some embodiments, the shift register unit further comprises a second pull-down control module 5, which is configured to maintain the voltage of the pull-up node PU at the reference voltage Vref1 and the gate driving signal "Output" at the gate-off voltage Vref2 in response to a second pull-down control signal VHD2 in the maintaining phase t4. The second pull-down control signal VHD2 has a phase opposite to that of the first pull-down control signal VHD1.

In the maintaining phase t4, the second pull-down control module 5 and the first pull-down control module 4 have the same function, i.e., maintaining the voltage of the pull-up node PU at the reference voltage Vref1 and the gate driving signal "Output" at the gate-off voltage Vref2, under control of respective pull-down control signals. Since the phases of the first pull-down control signal VHD1 and the second pull-down control signal VHD2 are opposite, the first pull-down control module 4 and the second pull-down control module 5 operate alternatingly, so that at any point in time in the maintaining phase t4 the voltage of the pull-up node PU is always maintained at the reference voltage Vref, and the gate driving signal "Output" is always maintained at the gate-off voltage Vref2. This avoids uncertainty of the gate driving signal "Output" due to the floating of the output terminal.

It will be appreciated that in an embodiment in which only the first pull-down control module 4 is comprised in the shift register unit, the uncertainty of the gate driving signal "Output" may be avoided by maintaining the first pull-down control signal VHD1 at the high level.

In some embodiments, the shift register unit further comprises a carry module 4 and a carry pull-down module 7.

The carry module 6 is configured to a) transmit the clock signal CLK to a carry terminal as a carry signal "Carry Out" in the output phase t2, and to b) transmit the clock signal CLK to the carry terminal to pull the voltage of the carry terminal down to the reference voltage Vref1 in the reset phase t3.

The carry pull-down module 7 is configured to a) maintain the pulled-down voltage of the carry terminal at the reference voltage Vref1 in the reset phase t3, and to b) maintain the voltage of the carry terminal at the reference voltage Vref1 in the 1o maintaining phase t4.

The gate driving signal "Output" and the carry signal "Carry Out" are provided at separate output terminal and carry terminal, respectively, so that they would not affect each another. In the gate driving circuit described later, the carry signal "Carry Out" of the current shift register unit is provided as the input signal "Input" of another shift register unit, and is not affected by a load of the gate driving signal "Output" of the current shift register unit. Furthermore, power consumption of the shift register unit may be reduced by choosing a transistor with a low-power consumption to drive outputting of the gate driving signal "Output" and the carry signal "Carry Out". Of course, in an embodiment in which the carry module 6 and the carry pull-down module 7 are not introduced, the gate driving signal "Output" may be used as the carry signal "Carry Out". This facilitates reduction of the bezel of the display apparatus.

In some embodiments, the shift register unit further comprises a second reset module 8, which is configured to pull the voltage of the carry terminal down to the reference voltage Vref1 in response to a second reset signal Rst2 in the reset phase t3. Existence of the second reset module 8 enables quickly pulling down the voltage of the carry terminal to the reference voltage Vref1.

Figure 3:
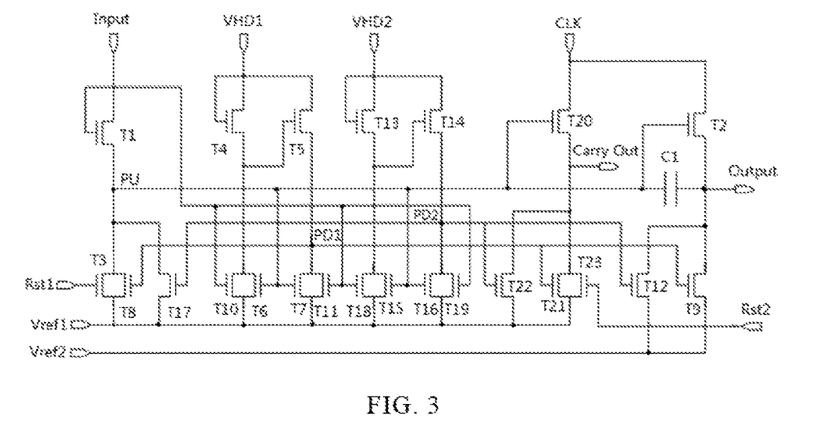
FIG. 3 shows an exemplary circuit diagram of the shift register unit shown in FIG. 1.

Now referring to FIG. 3, it shows an example circuit of the shift register unit shown in FIG. 1.

In this example, the input module 1 comprises a first transistor T1. Both a control terminal and a first terminal of the first transistor T1 receive the input signal "Input", and a second terminal of the first transistor T1 is connected with the pull-up node PU. In the input phase t1, the input signal "Input" controls the first transistor T1 to turn on, and pulls up the voltage of the pull-up node PU.

In this example, the output module 2 comprises a second transistor T2. A control terminal of the second transistor T2 is connected with the pull-up node PU, a first terminal of the second transistor T2 receives the clock signal CLK, and a second terminal of the second transistor T2 (i.e., the output terminal) outputs the gate driving signal "Output".

At the start of the output phase t2, the voltage of the pull-up node PU controls the second transistor T2 to turn on, and the high level of the clock signal CLK is transmitted to the output terminal. Due to a boosting effect of a parasitic capacitor (e.g., a gate-drain parasitic capacitor and a gate-source parasitic capacitor) in the second transistor T2, the voltage of the pull-up node PU is further pulled up by a predetermined amount.

At the start of the reset phase t3, due to the boosting effect of the parasitic capacitor in the second transistor T2, the transition of the clock signal CLK from a high level to a low level causes the voltage of the pull-up node PU to be pulled down by a predetermined amount, being still a high level and capable of rendering the second transistor T2 in conduction. The voltage of the second terminal of the second transistor T2 is pulled down to a low level of the clock signal CLK, i.e., the reference voltage Vref1.

In practice, the parasitic capacitor in the second transistor T2 may couple a noise signal due to e.g. the high level of the clock signal CLK to the pull-up node PU. To reduce the influence caused by the parasitic capacitor, the shift register unit may further comprise a capacitor C1. A first terminal of the capacitor C1 is connected with the second terminal of the second transistor T2, and another terminal of the capacitor C1 is connected with the pull-up node PU. That is, the capacitor C1 is connected in parallel with the parasitic capacitor. From the perspective of the pull-up node PU, the capacitance on the side of the pull-up node PU is increased, thereby reducing the influence exerted by the noise of the clock signal CLK on the voltage of the pull-up node PU. This may enhance an anti-interference capability of the shift register unit.

In this example, the first reset module 3 comprises a third transistor T3. A control terminal of the third transistor T3 receives the first reset signal Rst1, a first terminal of the third transistor T3 is connected with the pull-up node PU, and a second terminal of the third transistor T3 is connected with a signal line for supplying the reference voltage Vref1.

At a certain time in the reset phase t3, the first reset signal Rst1 controls the third transistor T3 to turn on so that the pull-up node PU is in communication with the signal line supplying the reference voltage Vref1, thereby pulling the voltage of the pull-up node PU down to the reference voltage Vref1.

In this example, the first pull-down control module 4 comprises a fourth transistor T4, a fifth transistor T5, a sixth transistor T6, a seventh transistor T7, an eighth transistor T8 and a ninth transistor T9. A control terminal and a first terminal of the fourth transistor T4 both receive the first pull-down control signal VHD1, and a second terminal of the fourth transistor T4 is connected with a control terminal of the fifth transistor T5 and a first terminal of the sixth transistor T6. A first terminal of the fifth transistor T5 receives the first pull-down control signal VHD1, and a second terminal of the fifth transistor T5 is connected with a first pull-down node PD1. A control terminal of the sixth transistor T6 is connected with the pull-up node PU, and a second terminal of the sixth transistor T6 is connected with the signal line for supplying the reference voltage Vref1. A control terminal of the seventh transistor T7 is connected with the pull-up node PU, a first terminal of the seventh transistor T7 is connected with the first pull-down node PD1, and a second terminal of the seventh transistor T7 is connected with the signal line for supplying the reference voltage Vref1. A control terminal of the eighth transistor T8 is connected with the first pull-down node PD1, a first terminal of the eighth transistor T8 is connected with the pull-up node PU, and a second terminal of the eighth transistor T8 is connected with the signal line for supplying the reference voltage Vref1. A control terminal of the ninth transistor T9 is connected with the first pull-down node PD1, a first terminal of the ninth transistor T9 is connected with the second terminal of the second transistor T2, and a second terminal of the ninth transistor T9 is connected with a signal line for supplying the gate-off voltage Vref2.

In the reset phase t3, the first pull-down control signal VHD1 controls the fourth transistor T4 to turn on. When the voltage of the pull-up node PU is at a high level, the sixth transistor T6 and the seventh transistor T7 are turned on. Due to a width-to-length design of the fourth transistor T4 and the sixth transistor T6, the voltage of the second terminal of the fourth transistor T4 is still at a low level. After the first reset signal Rst1 comes, the voltage of the pull-up node PU is pulled down to the reference voltage Vref1 so that the sixth transistor T6 and the seventh transistor T7 are turned off. The turned-on fourth transistor T4 then controls the fifth transistor T5 to turn on so that the voltage of the first pull-down node PD1 transitions to a high level. Hence, the eighth transistor T8 is turned on to pull the voltage of the pull-up node PU down to the reference voltage Vref1, and the ninth transistor T9 is turned on to change the voltage of the second terminal of the second transistor T2 from the reference voltage Vref1 to the gate-off voltage Vref2.

In the maintaining phase t4, when the first pull-down control signal VHD1 is at a high level, the voltage of the first pull-down node PD1 is at a high level. Hence, the eighth transistor T8 is turned on to maintain the voltage of the pull-up node PU at the reference voltage Vref1, and the ninth transistor T9 is turned on to maintain the voltage of the second terminal of the second transistor T2 at the gate-off voltage Vref2.

Both the eighth transistor T8 and the third transistor T3 function to pull the voltage of the pull-up node PU down to the reference voltage Vref1 so that the voltage of the pull-up node PU can be pulled down more quickly.

In this example, the first pull-down control module 4 may further comprise a tenth transistor T10 and an eleventh transistor T1. A control terminal of the tenth transistor T10 receives the input signal "Input", a first terminal of the tenth transistor T10 is connected with the second terminal of the fourth transistor T4, and a second terminal of the tenth transistor T10 is connected with the signal line for supplying the reference voltage Vref1. A control terminal of the eleventh transistor T11 receives the input signal "Input", a first terminal of the eleventh transistor T11 is connected with the first pull-down node PD1, and a second terminal of the eleventh transistor T11 is connected with the signal line for supplying the reference voltage Vref1.

In the input phase t1, while pulling up the voltage of the pull-up node PU, the input signal "Input" further controls the tenth transistor T10 and the eleventh transistor T11 to turn on. Due to a width-to-length design of the fourth transistor T4 and the tenth transistor T10, the voltage of the second terminal of the fourth transistor T4 is still at a low level and renders the fifth transistor T5 turned off. The eleventh transistor T11 is turned on to pull the voltage of the first pull-down node PD1 to the reference voltage Vref1. As such, when pulling up the voltage of the pull-up node PU, the input signal "Input" pulls down the voltage of the first pull-down node PD1, thereby avoiding a situation where the conduction of the eighth transistor T8 and the ninth transistor T9 affects the voltages of the pull-up node PU and the output terminal. This improves reliability of the shift register unit.

In this example, the second pull-down control module 5 comprises a twelfth transistor T12, a thirteenth transistor T13, a fourteenth transistor T14, a fifteenth transistor T15, a sixteenth transistor T16 and a seventeenth transistor T17. A control terminal of the twelfth transistor T12 is connected with a second pull-down node PD2, a first terminal of the twelfth transistor T12 is connected with the second terminal of the second transistor T2, and a second terminal of the twelfth transistor T12 is connected with the signal line for supplying the gate-off voltage Vref2. A control terminal of the thirteenth transistor T13 and a first terminal of the thirteenth transistor T13 both receive the second pull-down control signal VHD2, and a second terminal of the thirteenth transistor T13 is connected with a control terminal of the fourteenth transistor T14 and a first terminal of the fifteenth transistor T15. A first terminal of the fourteenth transistor T14 receives the second pull-down control signal VHD2, and a second terminal of the fourteenth transistor T14 is connected with the second pull-down node PD2. A control terminal of the fifteenth transistor T15 is connected with the pull-up node PU, and a second terminal of the fifteenth transistor T15 is connected with the signal line for supplying the reference voltage Vref1. A control terminal of the sixteenth transistor T16 is connected with the pull-up node PU, a first terminal of the sixteenth transistor T16 is connected with the second pull-down node PD2, and a second terminal of the sixteenth transistor T16 is connected with the signal line for supplying the reference voltage Vref1. A control terminal of the seventeenth transistor T17 is connected with the second pull-down node PD2, a first terminal of the seventeenth transistor 17 is connected with the pull-up node PU, and a second terminal of the seventeenth transistor T17 is connected with the signal line for supplying the reference voltage Vref1.

In the output phase t2, the high level of the pull-up node PU can control both the fifteenth transistor T15 and the sixteenth transistor T16 to turn on. Due to a width-to-length design of the thirteenth transistor T13 and the fifteenth transistor T15, the voltage of the second terminal of the thirteenth transistor T13 is still at a low level and renders the fourteenth transistor T14 turned off. The turned-on sixteenth transistor 16 pulls the voltage of the second pull-down node PD2 down to the reference voltage Vref1. Hence, in the output phase t2, the voltage of the second pull-down node PD2 cannot turn on the twelfth transistor T12 and the seventeenth transistor T17, thereby avoiding the influence on the voltages of the pull-up node PU and the output terminal.

In the maintaining phase t4, when the second pull-down control signal VHD2 is at a high level, the thirteenth transistor T13 and the fourteenth transistor T14 are turned on so that the voltage of the second pull-down node PD2 is at a high level, and the twelfth transistor T12 and the seventeenth transistor T17 are turned on. The twelfth transistor T12 is turned on to maintain the voltage of the second terminal of the second transistor T2 at the gate-off voltage Vref2, and the seventeenth transistor T17 is turned on to maintain the voltage of the pull-up node PU at the reference voltage Vref1.

In this example, the second pull-down control module 5 may further comprise an eighteenth transistor T18 and a nineteenth transistor T19. A control terminal of the eighteenth transistor T18 receives the input signal "Input", a first terminal of the eighteenth transistor T18 is connected with the second terminal of the thirteenth transistor T13, and a second terminal of the eighteenth transistor T18 is connected with the signal line for supplying the reference voltage Vref1. A control terminal of the nineteenth transistor T19 receives the input signal Input, a first terminal of the nineteenth transistor T19 is connected with the second pull-down node PD2, and a second terminal of the nineteenth transistor T19 is connected with the signal line for supplying the reference voltage Vref1.

In the input phase t1, while pulling up the voltage of the pull-up node PU, the input signal "Input" further controls the eighteenth transistor T18 and the nineteenth transistor T19 to turn on. Due to a width-to-length design of the thirteenth transistor T13 and the eighteenth transistor T18, the voltage of the second terminal of the thirteenth transistor T13 is still at a low level and renders the fourteenth transistor T14 turned off. The turned-on of the nineteenth transistor T19 will pull the voltage of the second pull-down node PD2 down to the reference voltage Vref1. As such, when pulling up the voltage of the pull-up node PU, the input signal "Input" pulls down the voltage of the second pull-down node, thereby avoiding a situation where the conduction of the twelfth transistor T12 and the seventeenth transistor T17 affects the voltages of the pull-up node PU and the output terminal. This improves reliability of the shift register unit.

In this example, the carry module 6 comprises a twentieth transistor T20. A control terminal of the twentieth transistor T20 is connected with the pull-up node PU, a first terminal of the twentieth transistor T20 receives the clock signal CLK, and a second terminal of the twentieth terminal T20 (i.e., the carry terminal) outputs the carry signal "Carry Out".

In the output phase t2, the voltage of the pull-up node PU controls the twentieth transistor T20 to turn on, and the high level of the clock signal CLK is output to the second terminal of the twentieth transistor 120 as the carry signal. At an immediate entry into the reset phase t3, the voltage of the pull-up node PU continues to control the twentieth transistor T20 in conduction, and the low level (reference voltage Vref1) of the clock signal CLK is output to the twentieth transistor T20.

In this example, the carry pull-down module 7 comprises a twenty-first transistor T21 and a twenty-second transistor T22. A control terminal of the twenty-first transistor T21 is connected with the first pull-down node PD1, a first terminal of the twenty-first transistor T21 is connected with the second terminal of the twentieth transistor T20, and a second terminal of the twenty-first transistor T21 is connected with the signal line for supplying the reference voltage Vref1. A control terminal of the twenty-second transistor T22 is connected with the second pull-down node PD2, a first terminal of the twenty-second transistor T22 is connected with the second terminal of the twentieth transistor T20, and a second terminal of the twenty-second transistor T22 is connected with the signal line for supplying the reference voltage Vref1.

In the reset phase t3, the high level of the first pull-down node PD1 controls the twenty-first transistor T21 to turn on, and the voltage of the second terminal of the twentieth transistor T20 is maintained at the reference voltage Vref1.

In the maintaining phase t4, the high level of the first pull-down node PD1 controls the twenty-first transistor 121 to turn on, and the high level of the second pull-down node PD2 controls the twenty-second transistor T22 to turn on. The voltage of the second terminal of the twentieth transistor T20 is maintained at the reference voltage Vref1.

In this example, the second reset module 8 comprises a twenty-third transistor T23. A control terminal of the twenty-third transistor T23 receives the second reset signal Rst2, a first terminal of the twenty-third transistor T23 is connected with the second terminal of the twentieth transistor T20, and a second terminal of the twenty-third transistor T23 is connected with the signal line for supplying the reference voltage Vref1.

In the reset phase t3, the second reset signal Rst2 controls the twenty-third transistor T23 to turn on, pulling down the voltage of the carry terminal to the reference voltage Vref1. The cooperation of the twenty-third transistor T23 and the twenty-first transistor T21 enables the voltage of the carry terminal to be pulled down to the reference voltage Vref1 more quickly.

In the above embodiments, the first transistor T1 to the twenty-third transistor T23 are described and illustrated as N-type transistors. However, P-type transistors and corresponding timing signals, where appropriate, may be used to implement the same function. A gate voltage for turning on the P type transistors is a low-level voltage, and a gate voltage for turning off the P type transistors is a high-level voltage.

Figure 5:
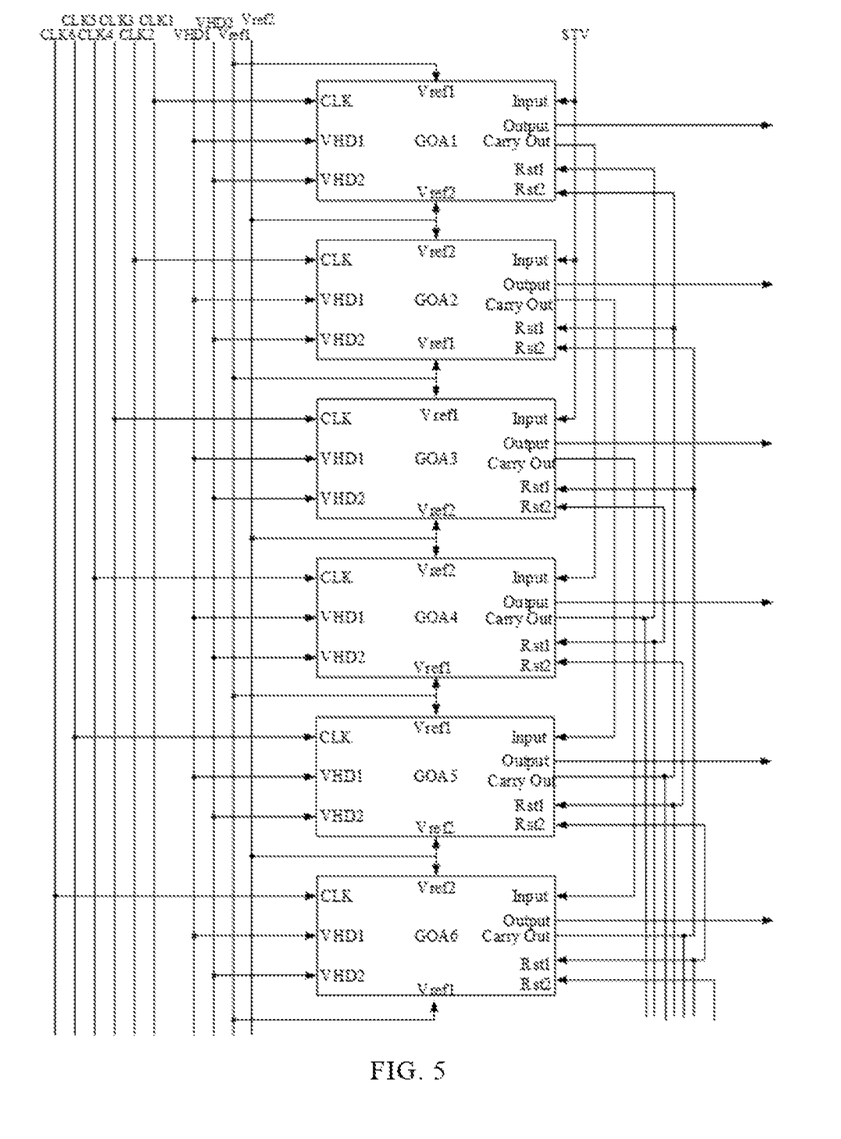
FIG. 5 schematically shows a block diagram of a gate driving circuit according to an embodiment of the present disclosure.

Referring to FIG. 5, it shows a gate driving circuit according to an embodiment of the present disclosure, which comprises several cascaded shift register units as described above. Details of the shift register unit have been set forth above, and will not be repeated here.

FIG. 5 shows exemplary cascading of a plurality of shift register units. The carry signal "Carry Out" output by the n-th shift register unit is provided as the input signal "Input" of the (n+1)-th shift register unit. The carry signal "Carry Out" output by the n-th shift register unit is provided as the first reset signal Rst1 of the (n−1)-th shift register unit. The carry signal "Carry Out" output by the (n+1)-th shift register unit is provided as the second reset signal Rst2 of the (n−k)-th shift register unit. The carry signal "Carry Out" output by the (n+1)-th shift register unit is provided as the first reset signal Rst1 of the (n+1−k)-th shift register unit, n is an integer larger than or equal to 4, and k is an integer smaller than n and larger than or equal to 3.

In the example shown in FIG. 5, the shift register units GOA1 to GOA6 are respectively connected to a first clock signal line to a sixth clock signal line, namely, they receive a first clock signal CLK1 to a sixth clock signal CLK6, respectively. GOA1 to GOA6 are connected with the same first pull-down control signal line, namely, they receive the same first pull-down control signal VHD1. GOA1 to GOA6 are connected with the same second pull-down control signal line, namely, they receive the same second pull-down control signal VHD2. GOA1 to GOA6 are connected with the same signal line for supplying the reference voltage Vref1, namely, they receive the same reference voltage Vref1. GOA1 to GOA6 are connected with the same signal line for supplying the gate-off voltage Vref2, namely, they receive the same gate-off voltage Vref2. A frame start signal STV is provided as the input signal "Input" of GOA1 to GOA3. The output terminals of GOA1 to GOA6 provide the gate driving signals "Output" to corresponding gate lines.

The carry signal "Carry Out" output by GOA1 is provided as the input signal "Input" of GOA4. The carry signal "Carry Out" output by GOA4 is provided as the first reset signal Rst1 of GOA1. The carry signal "Carry Out" output by GOA5 is provided as the second reset signal Rst2 of GOA1.

The carry signal "Carry Out" output by GOA2 is provided as the input signal "Input" of GOA5. The carry signal "Carry Out" output by GOA5 is provided as the first reset signal Rst1 of GOA2. The carry signal "Carry Out" output by GOA6 is provided as the second reset signal Rst2 of GOA2.

The carry signal "Carry Out" output by GOA3 is provided as the input signal "Input" of GOA6. The carry signal "Carry Out" output by GOA6 is provided as the first reset signal Rst1 of GOA3. The carry signal output by a next shift register unit (not shown) of GOA6 is provided as the second reset signal Rst2 of GOA3.

The connection of GOA4 to GOA6 and further shift register units (not shown) is similar and omitted here for the sake of brevity.

Embodiments of the present disclosure further provide a method of driving a gate driving circuit including a plurality of shift register units. Referring to FIGS. 1 and 4, the method comprises performing the following steps for each shift register unit.

In the input phase t1, the input module 1 transmits the input signal "Input" to the pull-up node PU to pull up the voltage of the pull-up node PU.

In the output phase t2, the output module 2 transmits the clock signal CLK to the output terminal as the gate-on voltage and further pulls up the voltage of the pull-up node PU by a predetermined amount.

In the reset phase t3, the output module 2 transmits the clock signal CLK to the output terminal to pull the voltage of the output terminal down to the reference voltage Vref1 and pulls down the voltage of the pull-up node PU by a predetermined amount. The first reset module 3 further pulls down the pulled-down voltage of the pull-up node PU to the reference voltage Vref1 in response to the first reset signal Rst1. The first pull-down control module 4 changes the pulled-down voltage of the output terminal from the reference voltage Vref1 to the gate-off voltage Vref2 in response to the first pull-down control signal VHD1.

In the maintaining phase t4, the pull-down control module 4 maintains the voltage of the pull-up node PU at the reference voltage Vref1 and the voltage of the output terminal at the gate-off voltage Vref2 in response to the first pull-down control signal VHD1.

Details of respective phases of the method have been described in the above embodiments described in conjunction with FIGS. 1, 3 and 4, and are omitted here for the sake of brevity.

The gate driving signal is first pulled down from a high level VGH to the reference voltage Vref1 that is less than the gate-off voltage Vref2, and then changed into the gate-off voltage Vref. As compared with being pulled down directly to the gate-off voltage Vref2, the gate driving signal falls to a predetermined value (e.g., 10% (VGH−Vref2)) in a shorter time interval, thereby achieving a fast reset.

In addition, in the maintaining phase t4, the gate driving signal "Output" is maintained at the gate-off voltage Vref2 so that the display apparatus can operate in a stable state.

Figure 6:
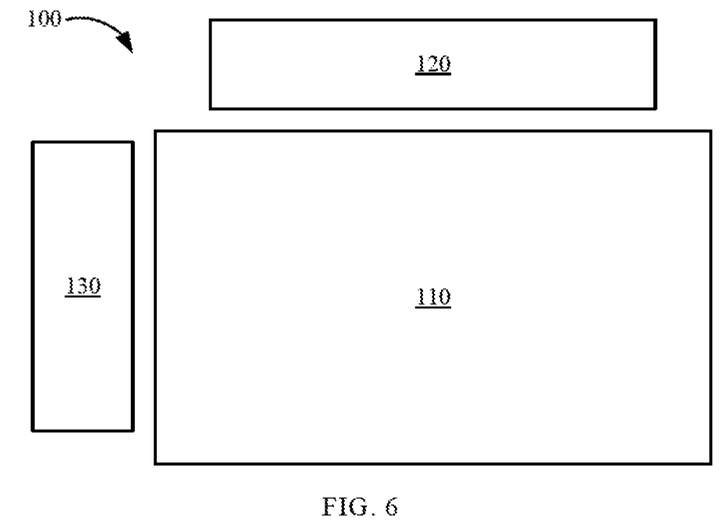
FIG. 6 schematically shows a block diagram of a display apparatus according to an embodiment of the present disclosure.

FIG. 6 is a schematic diagram of a display apparatus 100 according to an embodiment of the present disclosure. Referring to FIG. 6, the display apparatus 100 comprises a display panel 110 for displaying images, a data driving circuit 120 for outputting data voltages to the display panel 110, and a gate driving circuit 130 for outputting gate voltages to the display apparatus 110. The gate driving circuit 130 may be the gate driving circuit described in the above embodiments, detailed description of which is omitted here.

Examples of the display panel 110 comprise a liquid crystal display panel and an organic light-emitting diode display panel. In some embodiments, the data driving circuit 120 and the gate driving circuit 130 may be integrated on the display panel 110. In some embodiments, at least one of the data driving circuit 120 and the gate driving circuit 130 may form a separate chip.

The foregoing are merely specific embodiments of the present disclosure, to which the scope of the present disclosure is not limited. Variations or substitutions readily envisaged by those skilled in the art should be encompassed in the scope of the present disclosure. Thus, the scope of the present disclosure should be subject to the appended claims.

What is claimed is:

1. A shift register unit comprising:
an input module configured to transmit an input signal to a pull-up node in an input phase to pull up a voltage of the pull-up node;
an output module configured to a) in an output phase transmit a clock signal to an output terminal as a gate-on voltage and further pull up the voltage of the pull-up node by an amount, and to b) in a reset phase transmit the clock signal to the output terminal to pull a voltage of the output terminal down to a reference voltage and pull the voltage of the pull-up node down by the amount;
a first reset module configured to further pull the pulled-down voltage of the pull-up node down to the reference voltage in response to a first reset signal in the reset phase; and
a first pull-down control module configured to, responsive to a first pull-down control signal, a) change the pulled-down voltage of the output terminal from the reference voltage to a gate-off voltage in the reset phase, and b) maintain the voltage of the pull-up node at the reference voltage and the voltage of the output terminal at the gate-off voltage in a maintaining phase, the reference voltage being smaller than the gate-off voltage.

2. The shift register unit of claim 1, wherein the input module comprises a first transistor having a control terminal and a first terminal that both receive the input signal, and a second terminal connected with the pull-up node.

3. The shift register unit of claim 1, wherein the output module comprises a second transistor having a control terminal connected with the pull-up node, a first terminal that receives the clock signal, and a second terminal connected with the output terminal.

4. The shift register unit of claim 1, wherein the first reset module comprises a third transistor having a control terminal that receives the first reset signal, a first terminal connected with the pull-up node, and a second terminal that receives the reference voltage.

5. The shift register unit of claim 1, wherein the first pull-down control module comprises:
a fourth transistor having a control terminal and a first terminal that both receive the first pull-down control signal, and a second terminal;
a fifth transistor having a control terminal connected with the second terminal of the fourth transistor, a first terminal that receives the first pull-down control signal, and a second terminal connected with a first pull-down node;
a sixth transistor having a control terminal connected with the pull-up node, a first terminal connected with the second terminal of the fourth transistor, and a second terminal that receives the reference voltage;
a seventh transistor having a control terminal connected with the pull-up node, a first terminal connected with the first pull-down node, and a second terminal that receives the reference voltage;
an eighth transistor having a control terminal connected with the first pull-down node, a first terminal connected with the pull-up node, and a second terminal that receives the reference voltage; and
a ninth transistor having a control terminal connected with the first pull-down node, a first terminal connected with the output terminal, and a second terminal that receives the gate-off voltage.

6. The shift register unit of claim 5, wherein the first pull-down control module further comprises:
a tenth transistor having a control terminal that receives the input signal, a first terminal connected with the second terminal of the fourth transistor, and a second terminal for receiving the reference voltage; and
an eleventh transistor having a control terminal for receiving the input signal, a first terminal connected with the first pull-down node, and a second terminal for receiving the reference voltage.

7. The shift register unit of claim 1, further comprising a second pull-down control module configured to maintain the voltage of the pull-up node at the reference voltage and the voltage of the output terminal at the gate-off voltage in response to a second pull-down control signal in the maintaining phase, the second pull-down control signal having a phase opposite to a phase of the first pull-down control signal.

8. The shift register unit of claim 7, wherein the second pull-down control module comprises:
a twelfth transistor having a control terminal connected with a second pull-down node, a first terminal connected with the output terminal, and a second terminal that receives the gate-off voltage;
a thirteenth transistor having a control terminal and a first terminal that both receive the second pull-down control signal, and a second terminal;
a fourteenth transistor having a control terminal connected with the second terminal of the thirteenth transistor, a first terminal that receives the second pull-down control signal, and a second terminal connected with the second pull-down node;
a fifteenth transistor having a control terminal connected with the pull-up node, a first terminal connected with the second terminal of the thirteenth transistor, and a second terminal that receives the reference voltage;
a sixteenth transistor having a control terminal connected with the pull-up node, a first terminal connected with the second pull-down node, and a second terminal that receives the reference voltage; and
a seventeenth transistor having a control terminal connected with the second pull-down node, a first terminal connected with the pull-up node, and a second terminal that receives the reference voltage.

9. The shift register unit of claim 8, wherein the second pull-down control module further comprises:
an eighteenth transistor having a control terminal that receives the input signal, a first terminal connected with the second terminal of the thirteenth transistor, and a second terminal that receives the reference voltage;
a nineteenth transistor having a control terminal that receives the input signal, a first terminal connected with the second pull-down node, and a second terminal that receives the reference voltage.

10. The shift register unit of claim 7, further comprising:
a carry module configured to a) transmit the clock signal to a carry terminal as a carry signal in the output phase, and to b) transmit the clock signal to the carry terminal in the reset phase to pull a voltage of the carry terminal down to the reference voltage; and a carry pull-down module configured to a) maintain the pulled-down voltage of the carry terminal at the reference voltage in the reset phase, and to b) maintain the voltage of the carry terminal at the reference voltage in the maintaining phase.

11. The shift register unit of claim 10, wherein the carry module comprises a twentieth transistor having a control terminal connected with the pull-up node, a first terminal that receives the clock signal, and a second terminal connected with the carry terminal.

12. The shift register unit of claim 10, wherein the carry pull-down module comprises:

a twenty-first transistor having a control terminal connected with a first pull-down node, a first terminal connected with the carry terminal, and a second terminal that receives the reference voltage; and a twenty-second transistor having a control terminal connected with a second pull-down node, a first terminal connected with the carry terminal, and a second terminal that receives the reference voltage.

13. The shift register unit of claim 10, further comprising a second reset module configured to pull the voltage of the carry terminal down to the reference voltage in response to a second reset signal in the reset phase.

14. The shift register unit of claim 13, wherein the second reset module comprises a twenty-third transistor having a control terminal that receives the second reset signal, a first terminal connected with the carry terminal, and a second terminal that receives the reference voltage.

15. A gate driving circuit, comprising a plurality of cascaded shift register units as claimed in claim 1.

16. The gate driving circuit of claim 15, wherein each of the plurality of shift register units further comprises a second pull-down control module configured to maintain the voltage of the pull-up node at the reference voltage and the voltage of the output terminal at the gate-off voltage in response to a second pull-down control signal in the maintaining phase, the second pull-down control signal having a phase opposite to a phase of the first pull-down control signal.

17. The gate driving circuit of claim 16, wherein each of the plurality of shift register units further comprises:

a carry module configured to a) transmit the clock signal to a carry terminal as a carry signal in the output phase, and to b) transmit the clock signal to the carry terminal in the reset phase to pull a voltage of the carry terminal down to the reference voltage; and a carry pull-down module configured to a) maintain the pulled-down voltage of the carry terminal at the reference voltage in the reset phase, and to b) maintain the voltage of the carry terminal at the reference voltage in the maintaining phase.

18. The gate driving circuit of claim 17, wherein each of the plurality of shift register units further comprises a second reset module configured to pull the voltage of the carry terminal down to the reference voltage in response to a second reset signal in the reset phase.

19. The gate driving circuit of claim 18, wherein the carry signal from an n-th one of the plurality of shift register units is provided as the input signal of an (n+k)-th one of the plurality of shift register units and the first reset signal of an (n−k)-th one of the plurality of shift register units, and the carry signal from an (n+1)-th one of the plurality of shift register units is provided as the second reset signal of an (n−k)-th one of the plurality of shift register units and the first reset signal of an (n+1−k)th one of the plurality of shift register units, wherein n is an integer larger than or equal to 4 and k is an integer smaller than n and larger than or equal to 3.

20. A display apparatus, comprising the gate driving circuit as claimed in claim 15.

* * * * *